United States Patent [19]
Miller

[11] Patent Number: 6,115,909
[45] Date of Patent: Sep. 12, 2000

[54] ZIF PGA SOCKET TOOL

[76] Inventor: Dennis K. Miller, 1517 W. Knowles Cir., Mesa, Ariz. 85202

[21] Appl. No.: 09/318,567

[22] Filed: May 26, 1999

[51] Int. Cl.7 ........................................................ B23P 19/00
[52] U.S. Cl. ........................... 29/741; 29/758; 29/740; 29/739; 74/104
[58] Field of Search ................. 29/739, 740, 741, 29/758, 764, 839, 750; 74/104; 140/105

[56]  References Cited

U.S. PATENT DOCUMENTS

| | | | |
|---|---|---|---|
| 3,443,297 | 5/1969 | Lusby, Jr. ........................... | 29/740 |
| 3,628,244 | 12/1971 | Halstead ............................. | 29/626 |
| 3,896,533 | 7/1975 | Ullman et al. ..................... | 29/203 B |
| 4,387,951 | 6/1983 | Hall et al. .......................... | 339/193 R |
| 4,507,861 | 4/1985 | Sprenkle ............................ | 29/741 |
| 4,659,138 | 4/1987 | Gosse et al. ....................... | 296/201 |
| 4,813,133 | 3/1989 | Locke et al. ....................... | 30/215 |
| 4,873,761 | 10/1989 | Korsunsky et al. ............... | 29/741 |
| 4,956,911 | 9/1990 | Zaremba et al. .................. | 29/721 |
| 5,052,101 | 10/1991 | Bright et al. ...................... | 29/749 |
| 5,210,939 | 5/1993 | Mallik et al. ...................... | 29/840 |
| 5,553,373 | 9/1996 | Sprayberry ........................ | 29/758 |
| 5,553,374 | 9/1996 | Hanks et al. ...................... | 29/762 |
| 5,730,615 | 3/1998 | Lai et al. ........................... | 439/342 |
| 5,833,483 | 11/1998 | Lai et al. ........................... | 439/342 |

*Primary Examiner*—Lee Young
*Assistant Examiner*—Sean Smith
*Attorney, Agent, or Firm*—Jordan M. Meschkow; Lowell W. Gresham; Meschkow & Gresham, P.L.C.

[57]  ABSTRACT

A ZIF PGA socket tool (42) for releasably coupling a pin grid array (PGA) chip (22) with a "latch-less" zero insertion force (ZIF) socket (20) includes a housing (44), a sled (46), and an actuator (48). The housing (44) is configured to be placed in fixed relation to the ZIF socket (20). The sled (46) includes rails (84) that slidably couple with corresponding grooves (82) in the housing (44). The sled (46) further includes a shoulder (98) configured to abut an edge (40) of the PGA chip (22). The actuator (48) includes a pin (122) that is received by a slotted opening (118) in the sled (46). The pin (122) and the slotted opening (118) form a cooperative relationship such that rotational movement of the actuator (48) produces rectilinear movement of the sled (46) so that the shoulder (98) of the sled (46) imparts a pushing force on the edge (40) of the PGA chip (22).

22 Claims, 8 Drawing Sheets

ZIF PGA SOCKET TOOL

TECHNICAL FIELD OF THE INVENTION

The present invention relates generally to zero insertion force sockets for pin grid array chips. More specifically, the present invention relates to a tool for coupling and decoupling a pin grid array chip with a zero insertion force socket.

BACKGROUND OF THE INVENTION

A zero insertion force (ZIF) socket is a chip socket into which it is possible to couple a pin grid array (PGA) chip without any downward insert force. A conventional ZIF socket includes a base, a slidably moving cover or sliding plate attached to the base, and a lever. The PGA chip is attached to the cover, and the lever is used to slide the cover relative to the base in order to make electrical contact between the PGA chip leads and corresponding contacts in the ZIF socket base.

ZIF sockets are used where chips may be regularly moved in and out of a socket. The ZIF socket is desirable over conventional chip sockets because the use of a high density lead arrangement on the PGA chip and the corresponding receptacles on a socket calls for the use of a large insertion force in the conventional chip sockets. This large insertion force may damage the PGA chip leads during insertion or removal.

While ZIF sockets having actuation mechanisms, such as levers, are well suited and acceptable for many uses in the industry, the levers can take an unacceptably large amount of space on the printed circuit board. Furthermore, the sockets must be spaced apart to permit operation of the levers. Accordingly, there has been considerable time and effort placed in reducing the size of ZIF sockets and eliminating the levers from the ZIF socket structure.

FIG. 1 shows a perspective view of a prior art "lever-less" ZIF socket 20 for connecting a PGA chip 22 to circuits on a printed circuit board 24 on which ZIF socket 20 is mounted. A lead surface 26 of PGA chip 22 includes a plurality of leads 28. Leads 28 are inserted in corresponding receptacles 30 of ZIF socket 20. A cover portion (not shown) of ZIF socket 20 may cover receptacles 30 such that leads 28 are positioned through corresponding holes in the cover portion prior to insertion into receptacles 30.

FIG. 2 shows a top view of one of receptacles 30 of ZIF socket 20. Each of receptacles 30 has a generally circular base section 32 and a neck 34. Receptacles 30 are oriented in ZIF socket 20 such that necks 34 are tilted approximately forty-five degrees relative to the sides of ZIF socket 20 (see FIG. 1). Leaf springs 36 are located in neck 34 of each of receptacles 30. In operation, leads 28 are inserted into corresponding base sections 32 of receptacles 30. Force, as depicted by an arrow 38, is then applied to edges 40 (FIG. 1) of PGA chip 22 to slide PGA chip 22 across the surface of ZIF socket 20. Thus, leads 28 are disposed into necks 34 and in electrical contact with leaf springs 36 without the use of a downward insert force.

PGA chip 22 may be a microprocessor chip to be installed in a consumer computer system during system assembly. Alternatively, following system assembly the need may arise to remove and/or replace PGA chip 22. For example, it may be desirable to replace PGA chip 22 with an upgraded chip or PCA chip 22 may be malfunctioning thus necessitating replacement of PGA chip 22. Accordingly, a need exists for a tool that can effectively couple and decouple PGA chip 22 from a "lever-less" ZIF socket, like ZIF socket 20, in a manufacturing environment and in a post-manufacturing environment, such as a repair shop.

SUMMARY OF THE INVENTION

Accordingly, it is an object of the present invention to provide a tool for releasably coupling a pin grid array (PGA) chip with a socket.

Another object of the invention is to provide a tool that slides the PGA chip relative to a "lever-less" zero insertion force (ZIF) socket.

Yet another object of the invention is to provide a tool that slides the PGA chip at angle to achieve electrical contact with a leaf spring system of the ZIF socket.

A further object of the invention is to provide a tool that is easy and economical to use in both a manufacturing environment and in a post-manufacturing environment.

The above and other advantages of the present invention are carried out in one form by a tool for releasably coupling a pin grid array (PGA) chip with a socket, wherein a plurality of leads on the PGA chip are inserted in corresponding receptacles of the socket. The tool includes a housing configured to be placed in fixed relation to the socket. A sled is slidably coupled to the housing and is configured to abut an edge of the PGA chip. An actuator is coupled to the sled for propelling the sled in order to enable the sled to impart a pushing force on the edge of the PGA chip.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 4:
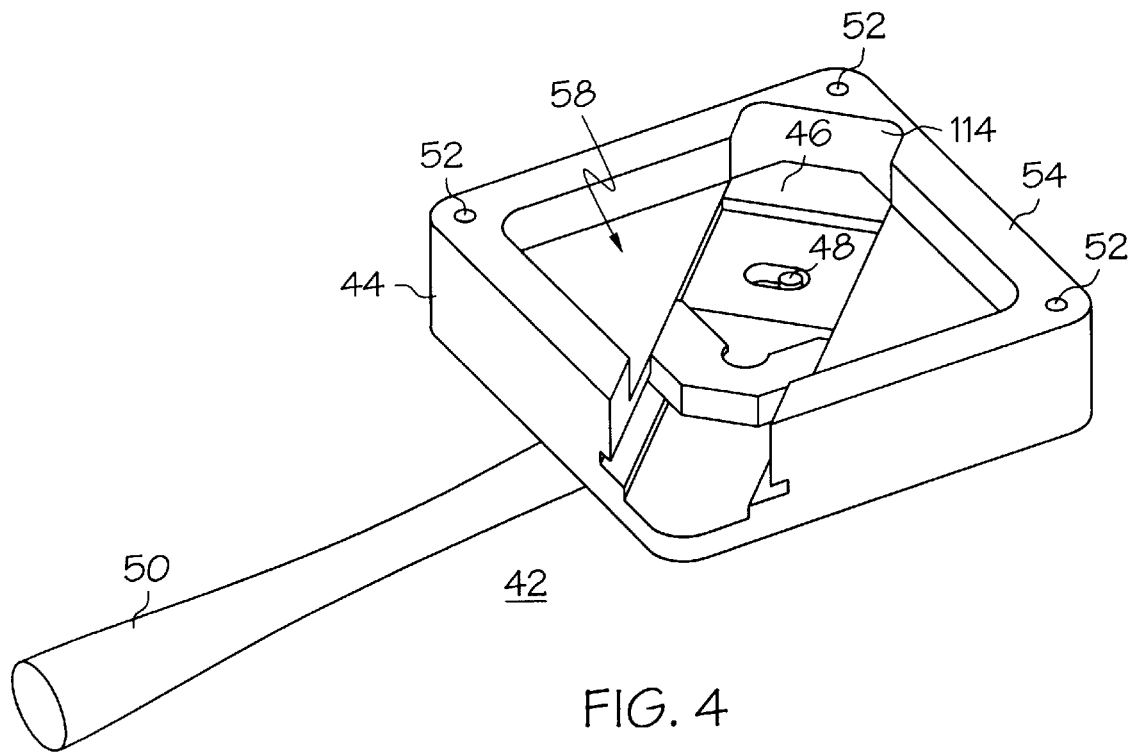
FIG. 4 shows a bottom perspective view of the ZIF PGA socket tool of FIG. 3.
Figure 5:
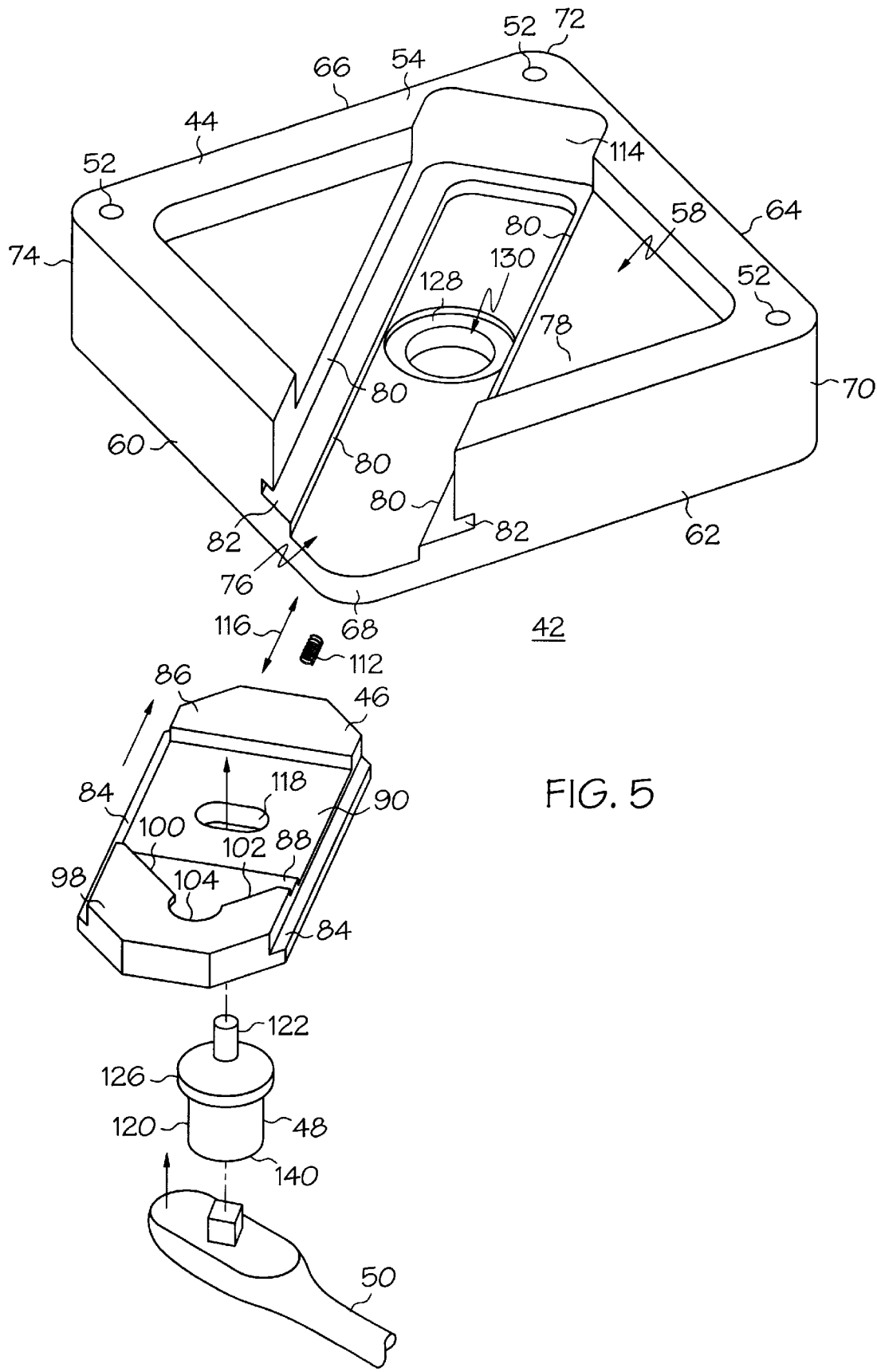
FIG. 5 shows an exploded perspective view of the tool.

Referring to FIGS. 1 and 3–5, FIG. 3 shows a top perspective view of a zero insertion force (ZIF) pin grid array (PGA) socket tool 42 according to the present invention for releasably coupling a PGA chip, such as PGA chip 22, with ZIF socket 20. FIG. 4 shows a bottom perspective view of ZIF PGA socket tool 42, and FIG. 5 shows an exploded perspective view of socket tool 42. Tool 42 includes a housing 44, a sled 46, an actuator 48, and a handle 50.

Housing 44 is configured to be placed in fixed relation to ZIF socket 20. Accordingly, apertures 52 are disposed in a surface 54 of housing 44 and are configured for attachment with corresponding posts 56 (see FIG. 1) that extend from circuit board 24 proximate ZIF socket 20. Surface 54 has a cavity 58 that extends into housing 44. Cavity 58 is sized to accommodate ZIF socket 20 and PGA chip 22 when apertures 52 are in engagement with posts 56.

Housing 44 has a first side 60, a second side 62, a third side 64, and a fourth side 66. Second side 62 adjoins first side 60 to form a first corner 68. Likewise, third side 64 adjoins second side 62 to form a second corner 70, fourth side 66 adjoins third side 64 to form a third corner 72, and fourth side 66 adjoins first side 60 to form a fourth corner 74. An elongated depression 76 is located in a floor 78 of cavity 58 and is directed from first corner 68 to third corner 72.

Elongated depression 76 is defined by walls 80 extending into floor 78. Walls 80 include grooves 82 directed along the length of walls 80. Sled 46 resides in elongated depression 76 and includes rails 84 that slidably couple with grooves 82.

Figure 1:
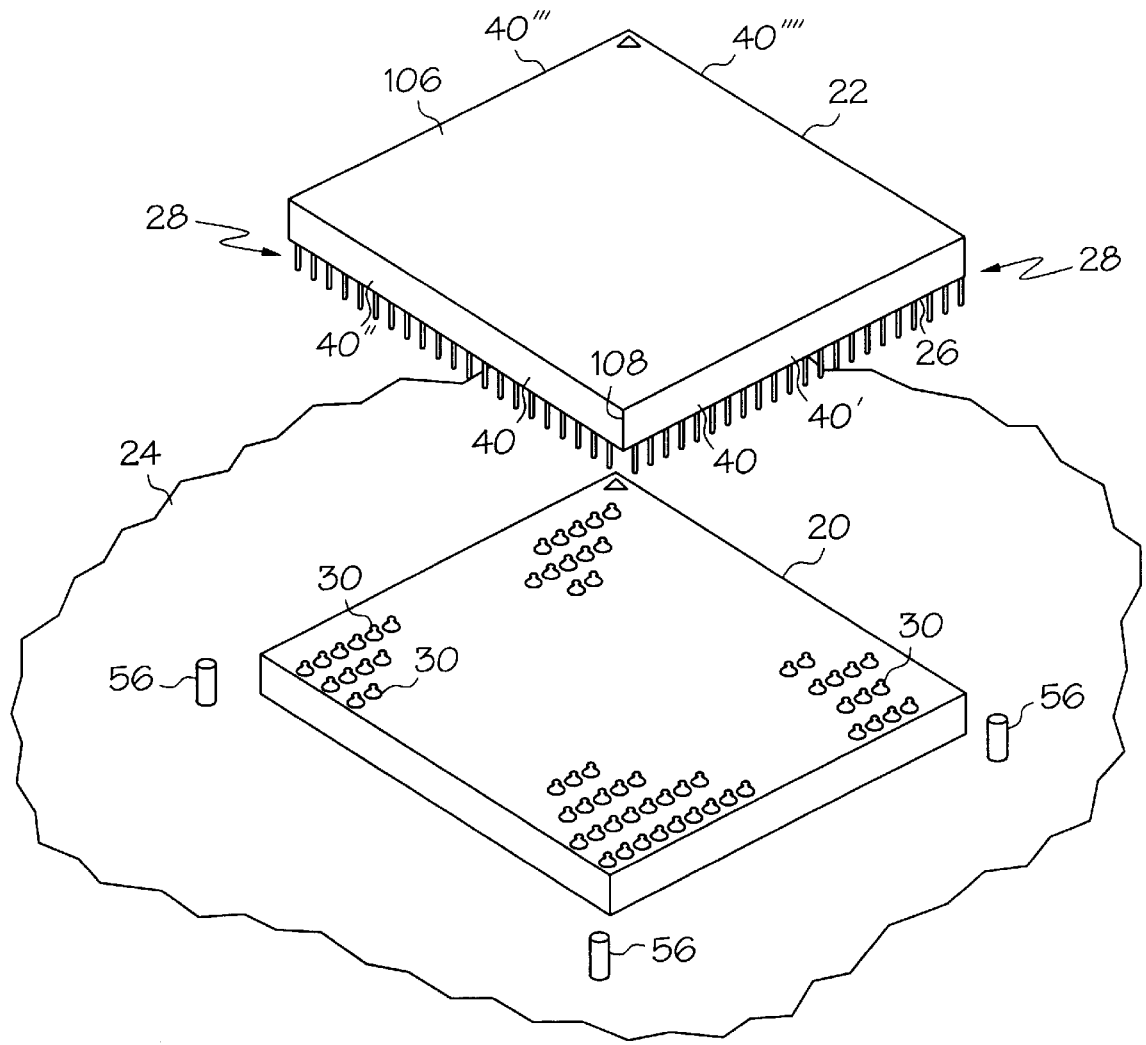
FIG. 1 shows a perspective view of a "lever-less" ZIF socket for connecting a PGA chip to circuits on a printed circuit board on which the ZIF socket is mounted.
Figure 6:
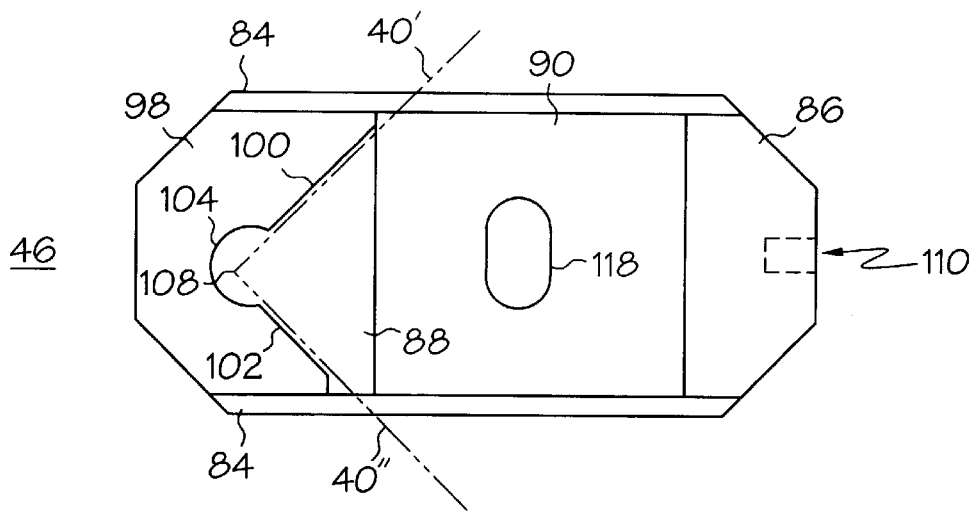
FIG. 6 shows a bottom view of a sled component of the tool.
Figure 7:
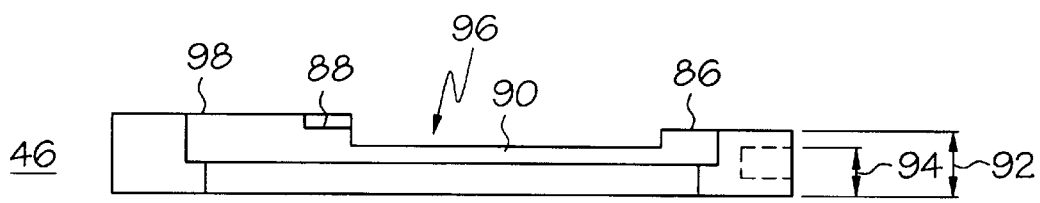
FIG. 7 shows a side view of the sled.

Referring to FIGS. 6–7 in connection FIGS. 1 and 5, FIG. 6 a top view of sled 46 of tool 42, and FIG. 7 shows a side view of sled 46. Sled 46 includes a first end portion 86, a second end portion 88, and a central portion 90 located therebetween. First and second end portions 86 and 88, respectively, exhibit a first thickness 92. Central portion 90 exhibits a second thickness 94. Second thickness 94 is less than first thickness 92 so that a recessed section 96 is formed in sled 46 between first and second end portions 86 and 88, respectively.

Second end portion 88 includes a shoulder 98 extending therefrom. Shoulder 98 has a first side 100, a second side 102 positioned substantially perpendicular to first side 100, and an arcuate side 104 positioned between first and second sides 100 and 102, respectively.

When housing 44 is placed in fixed relation to ZIF socket 20 by sliding apertures 52 over posts 56, first and second end portions 86 and 88 are configured to contact a top surface 106 of PGA chip 22. Due to recessed section 96, central portion 90 of sled 46 avoids contact with top surface 106 so that central portion 90 does not exert downward force on PGA chip 22. In addition, first side 100 is configured to abut a first edge 40' of PGA chip 22. Likewise, second side 102 is configured to abut a second edge 40" of PGA chip 22. Arcuate side 104 is configured to receive a corner 108 of PGA chip 22 which defines the intersection of first and second edges 40' and 40".

As rails 84 of sled 46 slide along grooves 82, first and second sides 100 and 102, respectively, impart a pushing force on edges 40. First and second sides 100 and 102 are configured to impart substantially equally distributed pushing forces to their respective first and second edges 40' and 40". In contrast, arcuate side 104 is shaped such that a pushing force is not imparted directly to corner 108 of PGA chip 22. This configuration of shoulder 98 avoids the application of excessive and potentially damaging force to corner 108 of PGA chip 22.

In the preferred embodiment, PGA chip 22 is rectangular in shape. Accordingly, arcuate side 104 is offset toward second side 102, such that second side 102 is shorter than first side 100. This configuration allows a substantially equally distributed pushing force to be imparted on each of first and second edges 40' and 40". Those skilled in the art will readily recognize that if PGA chip 22 is square in shape, arcuate side 104 need not be offset, and first and second sides 100 and 102, respectively, would be equal in length.

First end portion 86 includes an opening 110 from which a spring 112 extends. Spring 112 is configured to abut a cavity wall 114 of cavity 58 and exert a spring force, depicted by an arrow 116, between sled 46 and cavity wall 114 as sled 46 slides in housing 44. The function of spring force 116 will be discussed in greater detail below.

Figure 9:
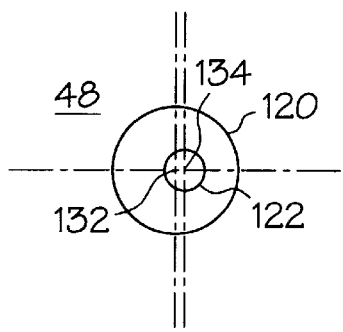
FIG. 9 shows a top view of the actuator.
Figure 8:
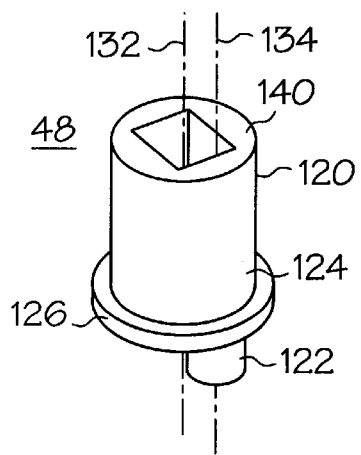
FIG. 8 shows a perspective view of an actuator component of the tool for propelling the sled.

Central portion 90 of sled 46 includes a slotted opening 118 for receiving actuator 48. Referring to FIGS. 8–9 in connection FIGS. 1 and 5, FIG. 8 shows a perspective view of actuator 48 for propelling sled 46. FIG. 9 shows a bottom view of actuator 48. Actuator 48 includes a shaft 120 and a pin 122 extending from a first end 124 of shaft 120. A collar 126 extends about first end 124 of shaft 120. Shaft 120 is configured to be disposed in housing 44 such that collar 126 resides in a collar receiving area 128 of housing 44.

To assemble tool 42, actuator 48 is positioned in a passage 130 extending through housing 44 and collar 126 is seated in collar receiving area 128. Rails 84 of sled 46 are then slidably coupled to grooves 82 of housing 44. Sled 46 is slid in elongated depression 76 until slotted opening 118 is aligned with shaft 120 of actuator 48. Pin 122 is then directed through slotted opening 118 and press-fit into a pin receiving orifice (not shown) on first end 124 of shaft 120. Thus, pin 122 effectively couples actuator 48 to sled 46 via slotted opening 118.

Shaft 120 exhibits a longitudinal axis 132. Likewise, pin 122 exhibits a longitudinal axis 134. Longitudinal axis 134 is in eccentric alignment with longitudinal axis 132 so that pin axis 134 is offset from shaft axis 132. This eccentric configuration causes pin 122 to rotate around longitudinal axis 132 of shaft 120. Handle 50 couples to a second end 140 of shaft 120 and is employed to rotate shaft 120. Pin 122 and slotted opening 118 form a cooperative relationship such that the rotation of shaft 120 produces rectilinear movement of sled 46 in elongated depression 76. In other words, as shaft 120 rotates, pin 122 pushes against slotted opening 118 forcing sled 46 to move along grooves 82 of housing 44.

Figure 2:
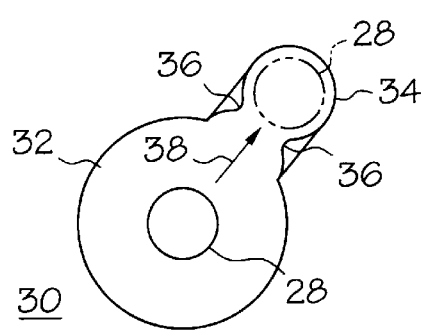
FIG. 2 shows a top view of one of the receptacles of the ZIF socket.
Figure 3:
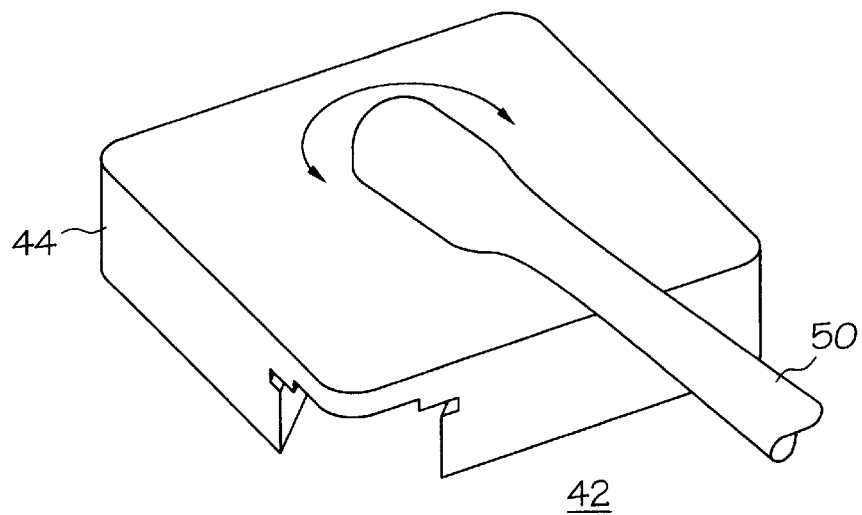
FIG. 3 shows a top perspective view of a zero insertion force (ZIF) pin grid array (PGA) socket tool according to the present invention for releasably coupling a PGA chip with the ZIF socket of FIG. 1.
Figure 10:
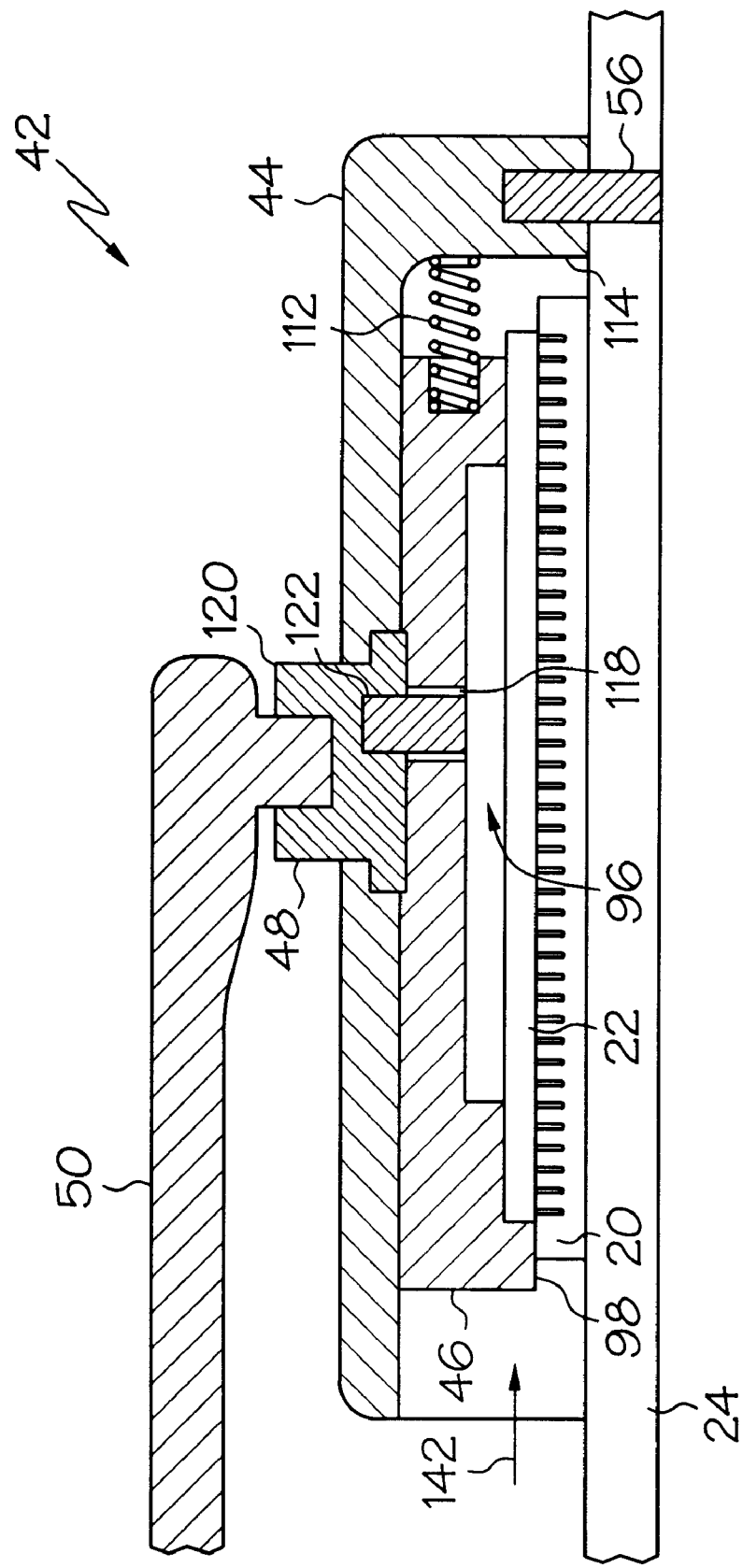
FIG. 10 shows a side cross-sectional view of the tool according to the present invention.

FIG. 10 shows a side cross-sectional view of tool 42 according to the present invention. Rotation of handle 50 causes actuator shaft 120 to rotate, which in turn, causes pin 122 and slotted opening 118 to work cooperatively to enable sled 46 to be propelled in a forward direction as indicated by an arrow 142. Shoulder 98 of sled 46, which abuts PGA chip 22, consequently imparts a pushing force against PGA chip 22. Referring momentarily to FIGS. 1 and 2, when leads 28 are positioned in base sections 32 of receptacles 30, the pushing force causes PGA chip 22 to slide so that leads 28 are moved into necks 34 of receptacles 30 to couple PGA chip 22 to ZIF socket 20 in electrical contact with leaf springs 36. With reference back to FIG. 10, spring 112 imparts a spring force on cavity wall 114 so that once leads 28 (FIG. 1) are slid past leaf springs 36 (FIG. 1), the spring force readily causes sled 46 to be moved in an opposite direction so that shoulder 98 no longer abuts PGA chip 22.

To release leads 28 from receptacles 30, tool 42 is placed in fixed relation to printed circuit board 24 such that now shoulder 98 pushes against opposite edges 40''' and 40'''' of PGA chip 22 in order to push leads 28 out of necks 34 of receptacles 30. Once leads 28 are moved back into base sections 32, PGA chip 22 may be lifted out of ZIF socket 20. Thus, tool 42 readily couples and decouples PGA chip 22 with ZIF socket 20 without imparting a potentially damaging downward insert force on PGA chip 22.

Figure 11:
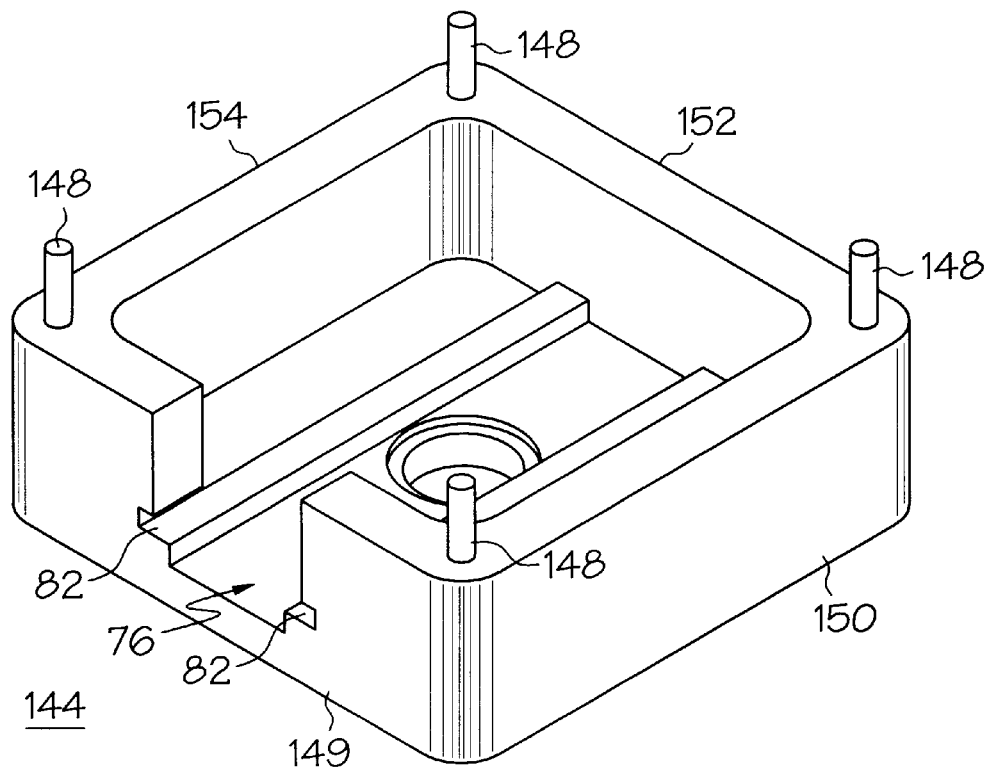
FIG. 11 shows a perspective view of an alternative embodiment of a housing component of the tool according to the present invention.
Figure 12:
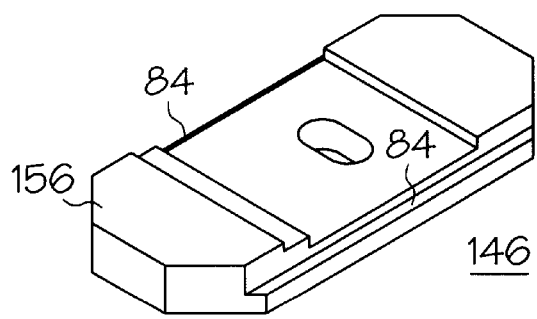
FIG. 12 shows a perspective view of an alternative embodiment of the sled.

Referring to FIGS. 11–12, FIG. 11 shows a perspective view of an alternative embodiment of a housing 144 of tool 42 according to the present invention and FIG. 12 shows a perspective view of a sled 146 to be used with housing 144. Housing 144 includes pins 148 configured to be seated in corresponding openings (not shown) of a circuit board (not shown) that are located proximate an alternative ZIF socket (not shown). Like apertures 52 (FIG. 5) and posts 56 (FIG. 1), pins 148 and the openings in the circuit board cooperate to allow housing 144 to be placed in fixed relation to the alternative ZIF socket.

Housing 144 includes a first side 149, a second side 150 adjoining first side 149, a third side 152 adjoining second side 152, and a fourth side 154 adjoining third side 152 and first side 149. Elongated depression 76 is directed from first side 149 to third side 152 of housing 144. Grooves 82 in elongated depression 76 are configured to receive rails 84 on sled 146. Sled 146 has a shoulder 156 configured to abut a single one of edges 40 of PGA chip 22. Housing 144 and sled 146 are used with an alternative "latch-less" ZIF socket having receptacles 30 (FIG. 2) that are oriented such that their necks 34 (FIG. 2) are substantially parallel with opposing edges of the PGA chip. Thus, PGA chip 22 is slid across the ZIF socket in a direction that is substantially parallel to the opposing edges 40 of PGA chip 22.

Figure 13:
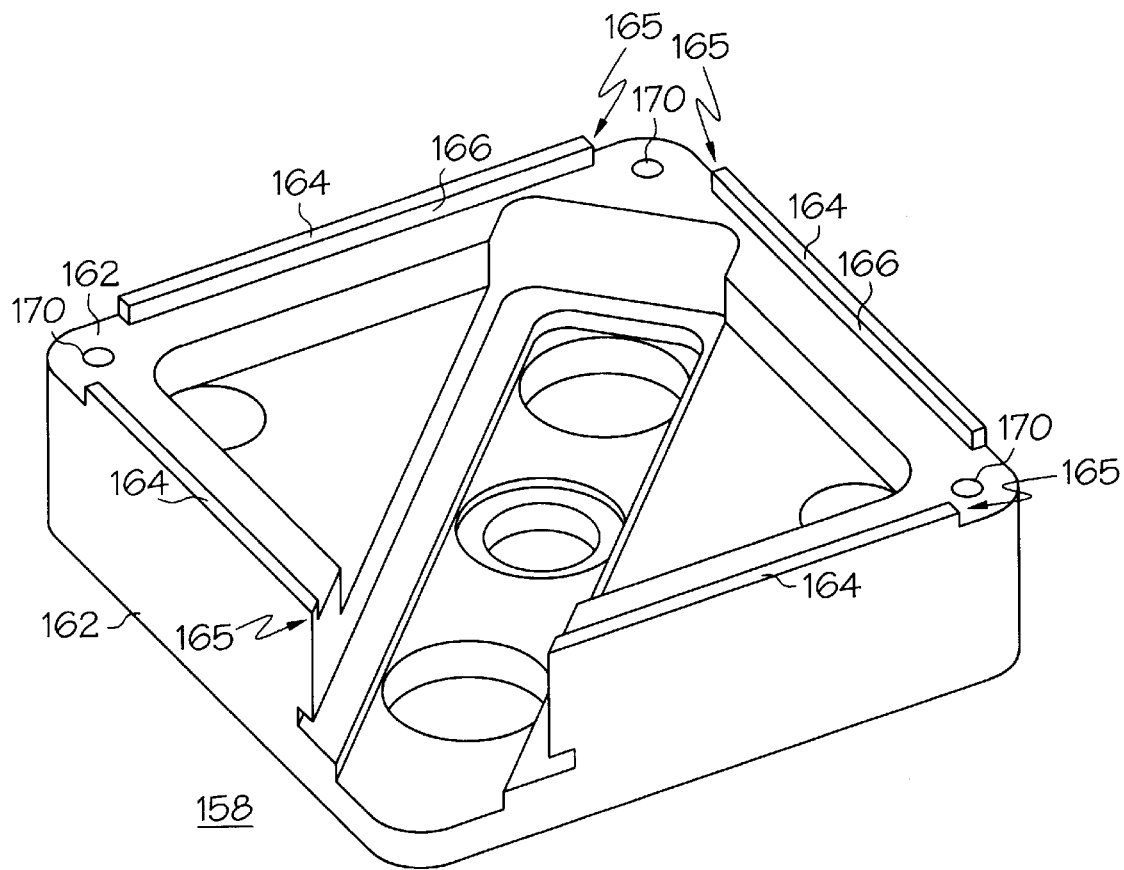
FIG. 13 shows a perspective view of a second alternative embodiment of the housing component of the tool.
Figure 14:
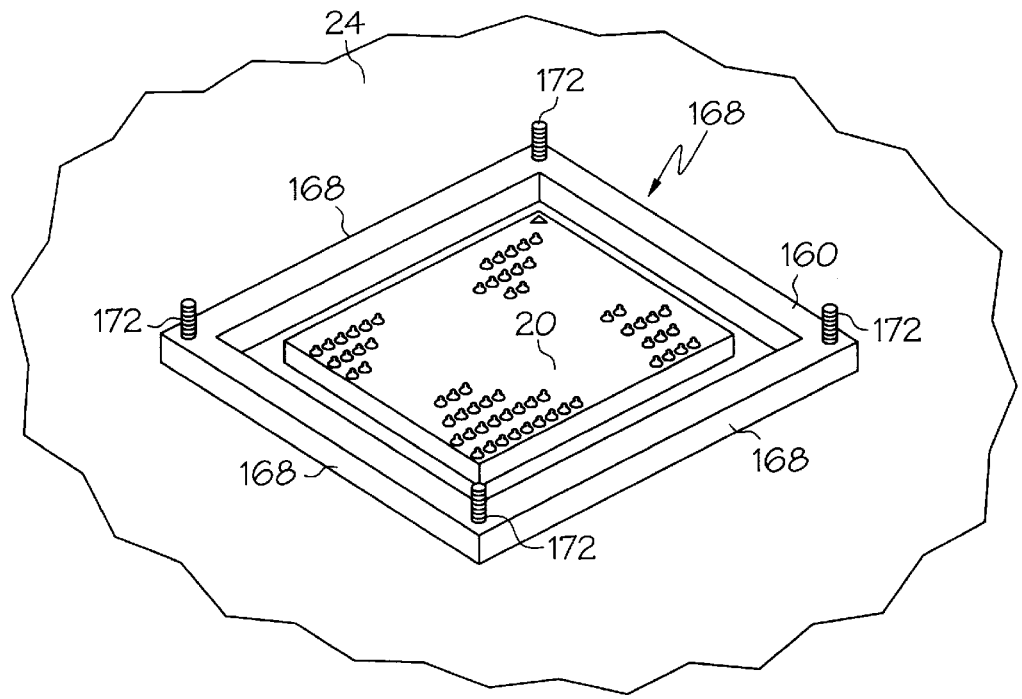
FIG. 14 shows the ZIF socket mounted on a printed circuit board and surrounded by a heat sink frame.
Figure 15:
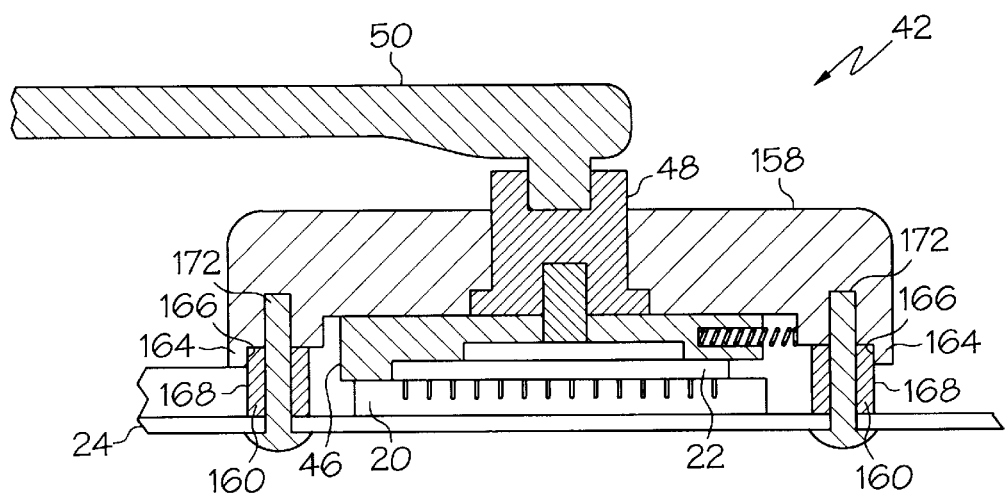
FIG. 15 shows a side cross-sectional view of the ZIF PGA socket tool having the second alternative housing and seated over the heat sink frame.

Referring to FIGS. 13–15, FIG. 13 shows a perspective view of a second alternative embodiment of a housing 158 component of tool 42. FIG. 14 shows ZIF socket 20 mounted on printed circuit board 24 and surrounded by a heat sink frame 160 also mounted on printed circuit board 24. FIG. 15 shows a side cross-sectional view of the ZIF PGA socket tool 42 with second alternative housing 158 and seated over heat sink frame 160. Like housing 44 (FIG. 5), housing 158 is configured to be placed in fixed relation to ZIF socket 20 and functions similarly to housing 44.

Housing 158 has a surface 162 configured to face circuit board 24 when tool 42 is placed in position over PGA chip 22 and ZIF socket 20. Ridges 164 extend from surface 162 at a perimeter 165 of surface 162. As best shown in FIG. 15, when tool 42 is placed in position over PGA chip 22 and ZIF socket 20, inner sides 166 of ridges 164 abut corresponding sides 168 of heat sink frame 160. Accordingly, like apertures 52 (FIG. 5) and posts 56 (FIG. 1) of housing 44, the abutment of inner sides 166 of ridges 164 against corresponding sides 168 of heat sink frame 160 allows housing 158 to be placed in fixed relation to ZIF socket 20 (FIG. 1).

Housing 158 also includes apertures 170 disposed in surface 162 of housing 158. Apertures 170 are configured for attachment with corresponding posts 172 that extend from heat sink frame 160. Posts 172 extend from heat sink frame 160 to accommodate auxiliary components, for example, a chip cooling fan, a cover, and the like. The combined fixation of both inner sides 166 of ridges 164 to corresponding sides 168 of heat sink frame 160 and apertures 170 to posts 172 ensures the secure placement of tool 42 relative to ZIF socket 20.

In summary, the present invention teaches of a tool for releasably coupling a pin grid array (PGA) chip with a "lever-less" zero insertion force socket. A sled shoulder is configured to abut one or more edges of the PGA chip. An actuator rotates to cause the sled to move in a rectilinear direction in order to slide the PGA chip across the surface of the ZIF socket so as to achieve electrical contact with a leaf spring system of the ZIF socket. The tool can be readily used in a manufacturing environment and in a post-manufacturing environment, such as a repair shop for installing, removing, and/or replacing pin grid array chips.

Although the preferred embodiments of the invention have been illustrated and described in detail, it will be readily apparent to those skilled in the art that various modifications may be made therein without departing from the spirit of the invention or from the scope of the appended claims. For example, the housing can be sized to accommodate a specific size and/or shape of a ZIF socket and PGA chip. In yet another example, the sled system can be used with a conventional "latch-less" ZIF socket having a slidably moving cover or sliding plate attached to a base. In such a configuration, the ZIF PGA socket tool would be adapted for sliding the cover relative to the base to releasably couple the PGA chip leads.

What is claimed is:

1. A tool for releasably coupling a pin grid array (PGA) chip with a socket, said PGA chip including a first edge and a second edge intersecting at a corner of said PGA chip wherein a plurality of leads on said PGA chip are inserted in corresponding receptacles of said socket, said tool comprising:

a housing configured to be placed in fixed relation to said socket;

a sled slidably coupled to said housing, said sled including a shoulder having a first side configured to abut said first edge of said PGA chip and a second side positioned substantially perpendicular to said first side and configured to abut said second edge of said PGA chip; and an actuator coupled to said sled for propelling said sled in order to enable said shoulder of said sled to impart a pushing force on said first and second edges of said PGA chip.

2. A tool for releasably coupling a pin grid array (PGA) chip with a socket attached to a circuit board, wherein a plurality of leads on said PGA chip are inserted in corresponding receptacles of said socket, posts extend from said circuit board proximate said socket, and said tool comprises:

a housing configured to be placed in fixed relation to said socket, said housing including apertures disposed in said housing, said apertures being configured for attachment to corresponding ones of said posts;

a sled slidably coupled to said housing and configured to abut an edge of said PGA chip; and an actuator coupled to said sled for propelling said sled in order to enable said sled to impart a pushing force on said edge of said PGA chip.

3. A tool for releasably coupling a pin grid array (PGA) chip with a socket attached to a circuit board, wherein a plurality of leads on said PGA chip are inserted in corresponding receptacles of said socket, openings extend into said circuit board proximate said socket, and said tool comprises:

a housing configured to be placed in fixed relation to said socket, said housing including pins configured to be seated in corresponding ones of said openings;

a sled slidably coupled to said housing and configured to abut an edge of said PGA chip; and an actuator coupled to said sled for propelling said sled in order to enable said sled to impart a pushing force on said edge of said PGA chip.

4. A tool for releasably coupling a pin grid array (PGA) chip with a socket attached to a circuit board, wherein a plurality of leads on said PGA chip are inserted in corresponding receptacles of said socket, a heat sink frame is coupled to said circuit board and surrounds said socket, and said tool comprises:

a housing configured to be placed in fixed relation to said socket, said housing including a surface configured to face said circuit board, and ridges extending from said surface of said housing proximate a perimeter of said surface, for abutting corresponding sides of said heat sink frame;

a sled slidably coupled to said housing and configured to abut an edge of said PGA chip; and an actuator coupled to said sled for propelling said sled in order to enable said sled to impart a pushing force on said edge of said PGA chip.

5. A tool as claimed in claim 4 wherein posts extend from said heat sink frame, and said housing further comprises apertures disposed in said housing, said apertures being configured for attachment to corresponding ones of said posts.

6. A tool as claimed in claim 1 wherein said socket is coupled to a circuit board, and said housing comprises a surface having a cavity extending into said housing configured to accommodate said socket and said PGA chip.

7. A tool as claimed in claim 6 wherein said housing further comprises an elongated depression located in a floor of said cavity and said sled resides in said elongated depression.

8. A tool as claimed in claim 7 wherein:

said elongated depression is defined by walls extending into said floor of said cavity;

one of said walls includes a groove directed along a length of said one wall; and said sled includes a rail for sliding engagement with said groove.

9. A tool for releasably coupling a pin grid array PGA chip with a socket coupled to a circuit board, wherein a plurality of leads on said PGA chip are inserted in corresponding receptacles of said socket, said tool comprising:

a housing configured to be placed in fixed relation to said socket, said housing including a surface having a cavity extending into said housing, said cavity being configured to accommodate said socket and said PGA chip, and said cavity having an elongated depression located in a floor of said cavity, and said housing further including:

a first side;

a second side adjoining said first side to form a first corner;

a third side adjoining said second side to form a second corner; and a fourth side adjoining said third side to form a third corner and adjoining said first side to form a fourth corner, said elongated depression being directed from said first corner to said third corner;

a sled residing in said elongated depression, said sled being slidably coupled to said housing and configured to abut an edge of said PGA chip; and an actuator coupled to said sled for propelling said sled in order to enable said sled to impart a pushing force on said edge of said PGA chip.

10. A tool as claimed in claim 7 wherein said housing further comprises:

a first side;

a second side adjoining said first side;

a third side adjoining said second side; and a fourth side adjoining said third and first sides, said elongated depression being directed from said first side to said third side.

11. A tool as claimed in claim 6 further comprising a spring extending from said sled and configured to abut a cavity wall of said cavity, said spring exerting a spring force between said sled and said cavity wall as said sled slides in said housing.

12. A tool as claimed in claim 1 wherein said plurality of leads of said PGA chip are located on a lead surface of said PGA chip and said sled comprises:

a first end portion exhibiting a thickness; and a second end portion exhibiting said thickness, said first and second end portions being configured to contact a surface of said PGA chip opposite said lead surface of said PGA chip.

13. A tool as claimed in claim 12 wherein said sled further comprises a central portion located between said first and second end portions, said central portion exhibiting a second thickness, said second thickness being less than said thickness of said first and second end portions to form a recessed section between said first and second end portions.

14. A tool for releasably coupling a pin grid array PGA chip with a socket, wherein said PGA chip includes a first edge and a second edge, said first and second edges intersect at a corner of said PGA chip, a plurality of leads on said PGA chip are inserted in corresponding receptacles of said socket, said plurality of leads of said PGA chip being located on a lead surface of said PGA chip, and said tool comprises:

a housing configured to be placed in fixed relation to said socket;

a sled slidably coupled to said housing and configured to abut an edge of said PGA chip, said sled including:

a first end portion exhibiting a thickness; and a second end portion exhibiting said thickness, said first and second end portions being configured to contact a surface of said PGA chip opposite said lead surface of said PGA chip, and said second end portion having a shoulder configured to abut said edge of said PGA chip, said shoulder including a first side configured to abut said first edge of said PGA chip, a second side positioned substantially perpendicular to said first side and configured to abut said second edge of said PGA chip, and an arcuate side positioned between said first and second sides, said arcuate side being configured to receive said corner of said PGA chip; and an actuator coupled to said sled for propelling said sled in order to enable said sled to impart a pushing force on said edge of said PGA chip.

15. A tool as claimed in claim 1 wherein said actuator comprises:

a shaft disposed in said housing; and a pin extending from an end of said shaft, said pin being configured to couple to said sled.

16. A tool for releasably coupling a pin grid array PGA chip with a socket, wherein a plurality of leads on said PGA chip are inserted in corresponding receptacles of said socket, said tool comprising:

a housing configured to be placed in fixed relation to said socket;

a sled slidably coupled to said housing and configured to abut an edge of said PGA chip, said sled including a slotted opening; and an actuator coupled to said sled for propelling said sled in order to enable said sled to impart a pushing force on said edge of said PGA chip, said actuator including a shaft disposed in said housing and a pin extending from an end of said shaft, said pin being configured to couple to said sled, wherein a longitudinal axis of said pin is in eccentric alignment with a longitudinal axis of said shaft, said slotted opening is configured to receive said pin, and said pin and said slotted opening form a cooperative relationship such that rotational movement of said shaft produces rectilinear movement of said sled.

17. A tool for releasably coupling a pin grid array PGA chip with a socket, wherein a plurality of leads on said PGA chip are inserted in corresponding receptacles of said socket, said tool comprising:

a housing configured to be placed in fixed relation to said socket;

a sled slidably coupled to said housing and configured to abut an edge of said PGA chip;

an actuator coupled to said sled for propelling said sled in order to enable said sled to impart a pushing force on said edge of said PGA chip, said actuator including a shaft disposed in said housing and a pin extending from an end of said shaft, said pin being configured to couple to said sled; and a handle coupled to a second end of said shaft for rotating said shaft.

18. A tool for releasably coupling a pin grid array PGA chip with a socket attached to a circuit board, said PGA chip including a first edge and a second edge intersecting at a corner of said PGA chip, wherein a plurality of leads located on a lead surface of said PGA chip are inserted in corresponding receptacles of said socket, said tool comprising:

a housing configured to be placed in fixed relation to said socket, said housing having a surface configured to face said circuit board, and said surface having a cavity extending into said housing for accommodating said socket and said PGA chip;

a sled disposed in said cavity and slidably coupled to said housing, said sled including:
a first end portion exhibiting a first thickness;
a second end portion exhibiting said first thickness, said first and second end portions being configured to contact a surface of said PGA chip opposite said lead surface, and said second end portion having a shoulder, said shoulder including a first side configured to abut said first edge of said PGA chip and a second side positioned substantially perpendicular to said first side and configured to abut said second edge of said PGA chip; and
a central portion located between said first and second end portions and exhibiting a second thickness, said second thickness being less than said first thickness to form a recessed section between said first and second end portions; and an actuator coupled to said sled and configured to propel said sled in order to enable said shoulder to impart a pushing force on said first and second edges of said PGA chip.

19. A tool as claimed in claim 18 wherein:
said housing further comprises walls extending into a floor of said cavity to form an elongated depression; one of said walls includes a groove directed along a length of said one wall; and
said sled includes a rail for sliding engagement with said groove.

20. A tool for releasably coupling a pin grid array (PGA) chip with a socket attached to a circuit board, wherein, said PGA chip includes a first edge and a second edge, said first and second edges intersect at a corner of said PGA chip, and a plurality of leads located on a lead surface of said PGA chip are inserted in corresponding receptacles of said socket, said tool comprising:

a housing configured to be placed in fixed relation to said socket, said housing having a surface configured to face said circuit board, said surface having a cavity extending into said housing for accommodating said socket and said PGA chip, walls of said housing extend into a floor of said cavity to form an elongated depression, and one of said walls includes a groove directed along a length of said one wall, said housing further comprising:
a first side;
a second side adjoining said first side to form a first corner;
a third side adjoining said second side to form a second corner; and
a fourth side adjoining said third side to form a third corner and adjoining said first side to form a fourth corner, said elongated depression being directed from said first corner to said third corner;

a sled disposed in said cavity and slidably coupled to said housing, said sled including:
a first end portion exhibiting a first thickness;
a second end portion exhibiting said first thickness, said first and second end portions being configured to contact a surface of said PGA chip opposite said lead surface, and said second end portion having a shoulder configured to abut an edge of said PGA chip, said shoulder including a first side configured to abut said first edge of said PGA chip, a second side positioned substantially perpendicular to said first side and configured to abut said second edge of said PGA chip, and an arcuate side positioned between said first and second sides, said arcuate side being configured to receive said corner of said PGA chip;
a central portion located between said first and second end portions and exhibiting a second thickness, said second thickness being less than said first thickness to form a recessed section between said first and second end portions; and
a rail for sliding engagement with said groove; and an actuator coupled to said sled and configured to propel said sled in order to enable said shoulder to impart a pushing force on said edge of said PGA chip.

21. A tool for releasably coupling a pin grid array (PGA) chip with a socket attached to a circuit board, wherein a plurality of leads located on a lead surface of said PGA chip are inserted in corresponding receptacles of said socket, a heat sink frame is coupled to said circuit board and surrounds said socket, and said tool comprises:

a housing configured to be placed in fixed relation to said socket, said housing having a surface configured to face said circuit board, and said surface having a cavity extending into said housing for accommodating said socket and said PGA chip, and said housing having ridges extending from said surface of said housing proximate a perimeter of said surface for abutting corresponding sides of said heat sink frame;

a sled disposed in said cavity and slidably coupled to said housing, said sled including:

a first end portion exhibiting a first thickness;

a second end portion exhibiting said first thickness, said first and second end portions being configured to contact a surface of said PGA chip opposite said lead surface, and said second end portion having a shoulder configured to abut an edge of said PGA chip; and a central portion located between said first and second end portions and exhibiting a second thickness, said second thickness being less than said first thickness to form a recessed section between said first and second end portions; and an actuator coupled to said sled and configured to propel said sled in order to enable said shoulder to impart a pushing force on said edge of said PGA chip.

22. A tool for releasably coupling a pin grid array (PGA) chip with a socket coupled to a circuit board, wherein a plurality of leads on said PGA chip are inserted in corresponding receptacles of said socket, said tool comprising:

a housing configured to be placed in fixed relation to said socket, said housing having a surface configured to face said circuit board, and said surface having a cavity extending into said housing configured to accommodate said socket and said PGA chip;

a sled slidably coupled to said housing and configured to abut an edge of said PGA chip, said sled having a slotted opening; and an actuator for moving said sled in said housing such that said sled imparts a pushing force on said edge of said PGA chip, said actuator including;

a shaft; and a pin extending from an end of said shaft for receipt into said slotted opening, said pin having a longitudinal axis in eccentric alignment with a longitudinal axis of said shaft, and said pin and said slotted opening forming a cooperative relationship such that rotational movement of said shaft produces rectilinear movement of said sled.

\* \* \* \* \*

UNITED STATES PATENT AND TRADEMARK OFFICE
CERTIFICATE OF CORRECTION

PATENT NO. : 6,115,909
DATED : September 12, 2000
INVENTOR(S) : Dennis K. Miller It is certified that error appears in the above-identified patent and that said Letters Patent is hereby corrected as shown below:

Column 7,
Line 42, change "PGA" to -- (PGA) --

Column 8,
Lines 28 and 61, change "PGA" to -- (PGA) --

Column 9,
Lines 16 and 32, change "PGA" to -- (PGA) --

Signed and Sealed this

Twenty-fourth Day of May, 2005

JON W. DUDAS
*Director of the United States Patent and Trademark Office*